United States Patent [19]

McDougall

[11] Patent Number: 4,985,679
[45] Date of Patent: Jan. 15, 1991

[54] MAGNET ASSEMBLY
[75] Inventor: Ian L. McDougall, Oxford, United Kingdom
[73] Assignee: Oxford Magnet Technology Limited, London, England
[21] Appl. No.: 445,113
[22] Filed: Sep. 29, 1989

Related U.S. Application Data

[63] Continuation of Ser. No. 210,172, Jun. 21, 1988, abandoned, which is a continuation of Ser. No. 807,949, Dec. 12, 1985, abandoned.

[30] Foreign Application Priority Data

Dec. 21, 1984 [GB] United Kingdom ................ 8432439

[51] Int. Cl.⁵ ............................................. G01R 33/20
[52] U.S. Cl. .................................... 324/318; 324/319
[58] Field of Search ............... 324/300, 303, 306, 307, 324/309, 318, 319, 320, 322; 335/216, 299; 336/232, DIG. 1

[56] References Cited

U.S. PATENT DOCUMENTS

| 3,199,021 | 8/1965 | Anderson | 324/320 |
|---|---|---|---|
| 3,287,630 | 11/1966 | Gang | 324/320 |
| 3,296,569 | 1/1967 | Ikegami | 324/320 |
| 3,470,828 | 10/1969 | Powell, Jr. et al. | 335/216 |
| 3,488,561 | 1/1970 | Anderson | 324/320 |
| 3,564,398 | 2/1971 | Nelson | 324/320 |
| 3,783,794 | 1/1974 | Gopfert et al. | 104/148 MS |
| 4,184,110 | 1/1980 | Hinshaw | 324/300 |
| 4,361,822 | 11/1982 | Adler | 335/303 |
| 4,374,360 | 2/1983 | Sepponen | 324/309 |
| 4,568,880 | 2/1986 | Sugimoto | 324/309 |
| 4,644,313 | 2/1987 | Miyajima | 324/318 |
| 4,673,882 | 6/1987 | Buford | 324/318 |
| 4,682,111 | 7/1987 | Hughes | 324/320 |
| 4,689,591 | 8/1987 | McDougall | 324/319 |
| 4,721,914 | 1/1988 | Fukushima | 324/320 |

FOREIGN PATENT DOCUMENTS 0108421 5/1984 European Pat. Off. .
0518712 7/1976 U.S.S.R. ................ 324/319

OTHER PUBLICATIONS

Review of Scientific Instruments, "Optimization of Homogeneous Electromagnetic Coil Systems: Application to Whole-Body NMR Imaging Magnets", vol. 52, No. 10, Oct. 1981, pp. 1501–1508.

Primary Examiner—Michael J. Tokar
Attorney, Agent, or Firm—Staas & Halsey

[57] ABSTRACT

A magnet assembly comprises an array of electrical coils (1–4) positioned side by side in the same sense and arranged such that in use when working currents are supplied to each coil (1–4) a magnetic field of control characteristics is continuously generated in a region (7) spaced from the coils.

15 Claims, 4 Drawing Sheets

CUBIC GRID OF OPTIMISATION POINTS

MULTIPROJECTION COIL ON SINGLE FORMER 0.5CM
35CM
5.0CM

MAGNET ASSEMBLY

This is a continuation of copending application Ser. No. 07/210,172 filed on June 21, 1988 now abandoned, which is a continuation of Ser. No. 06/807,949 filed on Dec. 12, 1985 and now abandoned.

FIELD OF THE INVENTION

The invention relates to magnet assemblies and in particular magnet assemblies for use in nuclear magnetic resonance (NMR) imaging apparatus and methods for their operation.

DESCRIPTION OF THE PRIOR ART

Up to now, NMR imaging apparatus has used solenoidal type magnet assemblies for generating the main magnetic field which is subsequently modified using superimposed gradient fields. It is important that this main magnetic field is substantially uniform within the imaging volume and the only practical way in which this can be achieved is by using a solenoidal magnet system. A major drawback of this arrangement is that a patient has to be positioned almost fully within the bore of the magnet assembly since the region of uniform magnetic field is centered at the geometric center of the assembly. This is undesirable both for the patient and for allowing doctors access to the patient during the scanning process.

SUMMARY OF THE INVENTION

In accordance with one aspect the present invention, a magnet assembly comprises an array of magnetic field generators positioned side by side in the same sense and arranged such that in use a magnetic field of controlled characteristics is continuously generated in a region spaced from the generators.

This invention represents a completely new approach to the construction of magnet assemblies since instead of arranging the magnetic field generators (such as electrical coils) coaxially as in the past, they are arranged side by side in an array. Since the region is spaced from the generators, there is no difficulty in obtaining access to the region and, for example, in the case of NMR imaging a patient is not encapsulated in any way and doctors have complete access to the patient during the scanning process.

The generators are arranged in the same sense when the direction from their North to South poles is substantially the same.

Preferably, the generators are laterally spaced in two dimensions.

The generators may be regularly or irregularly spaced apart, the latter arrangement assisting in the setting up of magnetic gradients which would be useful in NMR imaging and avoid the need for auxiliary gradient coils. Furthermore, the strengths of the magnetic fields generated by each generator will typically differ from its neighbors even when a uniform field is generated in the region.

In some cases, the magnetic field generators may comprise permanent magnets.

Preferably, however, the generators comprise electrical coils since this allows the magnetic field characteristics to be changed. The number of turns in each coil and the magnitude of the working currents can be calculated mathematically in a manner to be described below. The working currents may be supplied from a single power source if the coils are connected in series or alternatively, when the coils are not connected, from separate power sources supplying individual currents to respective coils.

In one particularly advantageous example, one of the end turns of each coil is positioned in a common plane. This leads to the generation of a substantially planar region which is particularly suitable for NMR imaging. In practice, the region will have a certain thickness but it can be arranged that this is small in comparison with the other dimensions of the region. Strictly, the region in this case has a cuboid form.

When the region is substantially planar, it is particularly advantageous if the magnet assembly further comprises a planar support of non-magnetic material positioned between the magnetic field generators and the region. In NMR imaging apparatus, this enables a patient to be laid on the support in the region when the region and support are arranged substantially horizontally. The support also hides the magnetic field generators of the magnet assembly thus increasing patient acceptance of the apparatus.

When large magnetic fields are required, for example 0.2 T, it is convenient to use electrical coils made from superconducting material. This requires that the coils are cooled to very low temperatures and this is conventionally achieved using cryostats cooled with liquid helium and liquid nitrogen. The cooling of the coils is particularly simple with magnet assemblies according to the invention since it is not necessary to gain access to the coils in use. This should be contrasted with the prior art where a patient is positioned in the bore of a solenoidal magnet. Thus, the form of the cryostat can be simplified.

In some cases, it may be desirable to generate a region with a relatively large thickness. This may conveniently be achieved by forming each magnetic field generator from a number of subsidiary generators, such as subsidiary coaxial coils, spaced along respective axes. Effectively, this is equivalent to superposing a number of arrays of electrical currents and their respective external fields.

Preferably, the magnetic field is substantially uniform within the region.

In general, where electrical coils are used, in order to simplify construction of the formers on which the coils are mounted, each coil has a circular cross-section. However, improved uniformity in a homogeneous region may be achieved by providing the coils with a semi-rectangular cross-section.

In accordance with another aspect of the present invention, a method of operating a magnet assembly comprising an array of electrical coils adapted to carry working currents and positioned side by side in the same sense comprises causing currents of controlled magnitudes to flow through the coils whereby a field of controlled characteristics is generated in the region.

By "controlled characteristics" we refer to the type of field produced eg. substantially uniform or with a gradient.

BRIEF DESCRIPTION OF THE DRAWINGS

Some examples of magnet assemblies according to the invention will now be described with reference to the accompanying drawings, in which.

DETAILED DESCRIPTION OF THE INVENTION

The examples described are all constituted by coils which typically are made of superconducting material and are thus positioned within a conventional liquid helium/nitrogen cryostat for cooling the coils to low temperatures. Such cryostats are well known and will not be further described or illustrated.

Figure 1:
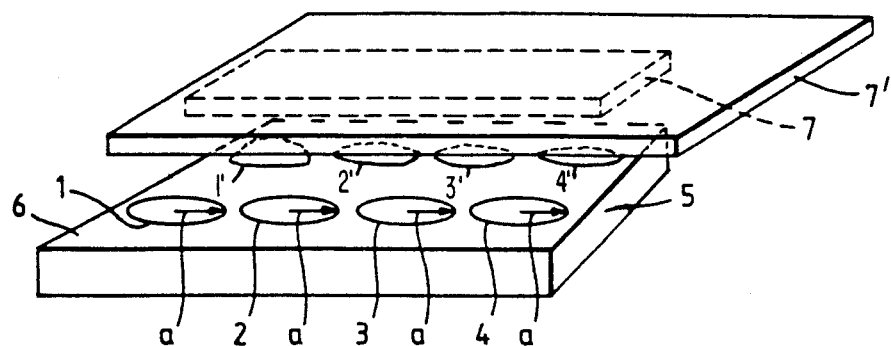
FIG. 1 illustrates schematically a first example of the invention.

The example shown in FIG. 1 comprises eight coils 1-4,1'-4' arranged side by side in a two dimensional array and mounted on respective formers (not shown). As just mentioned, the coils 1-4,1'-4' are positioned in a cryostat schematically indicated by reference numeral 5. It should be noted that an end turn of each coil 1-4 is positioned in a common plane 6.

In use, the coils 1-4,1'-4' are connected to a power supply for continuously supplying working currents to the coils. The currents flow through the coils in the same sense so that for example all the coils have North poles in the plane 6. The coils generate individual, usually different, magnetic fields which in a homogeneous region 7 combine to produce a substantially uniform magnetic field having a planar form and spaced from the plane 6.

The uniformity of the magnetic field in the homogeneous region 7 depends upon the number of amp turns of each coil 1-4 and on the spacing between the coils. One way in which these variables may be determined will now be described.

Figure 2:
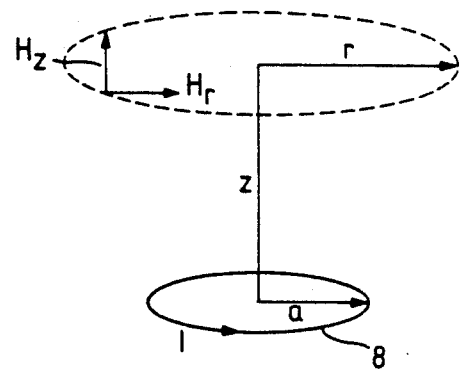
FIG. 2 illustrates a single arc of a coil and the definitions of various algebraic values.

Since we are concerned with field values at points distributed widely in space and remote from the field coils we can calculate the field at each point directly. FIG. 2 illustrates schematically a coil 8 having NI amp turns and a radius a. It is possible to determine the field components $H_z$ and $H_r$ by employing elliptic integrals.

The field component in the z direction $H_z$ (z,r) is given by:

$$\frac{2IN}{10a} \left[ [A]^* \left[ K(\phi) \cdot k + \left[ \frac{B}{C} \right] {}^*E(\phi)^*k \right] \right]$$

The field component in the r direction $H_4$ (z,r) is given by:

$$\frac{2IN}{10a} \left( \frac{z}{r} \right) \left[ [A]^* \left[ -K(\phi)^*k + \left[ \frac{D}{C} \right] {}^*E(\phi)^*k \right] \right]$$

where $$A = \frac{1}{[(1 + r/a)^2 + (z/a)^2]^{\frac{1}{2}}}$$

-continued $$B = 1 - \left(\frac{r}{a}\right)^2 - \left(\frac{z}{a}\right)^2$$

$$C = \left[1 - \left(\frac{r}{a}\right)\right]^2 + \left(\frac{z}{a}\right)^2$$

$$D = 1 + \left(\frac{r}{a}\right)^2 + \left(\frac{z}{a}\right)^2$$

k is modulus of elliptic integrals of the first and second kind.

$$k = [4(r/a)/((1 + r/a)^2 + (z/a)^2)]^{\frac{1}{2}}$$

IN is the number of amp turns ascribed to the arc.

$$K(\phi) = \frac{\pi}{2}\left(1 + \frac{1^2}{2^2}k^2 + \frac{1^2 \cdot 3^2}{2^2 \cdot 4^2}k^4 + \frac{1^2 \cdot 3^2 \cdot 5^2}{2^2 \cdot 4^2 \cdot 6^2}k^6 + \right.$$

$$\left. \frac{1^2 \cdot 3^2 \cdot 5^2 \cdot 7^2}{2^2 \cdot 4^2 \cdot 6^2 \cdot 8^2}k^8 + \frac{1^2 \cdot 3^2 \cdot 5^2 \cdot 7^2 \cdot 9^2}{2^2 \cdot 4^2 \cdot 6^2 \cdot 8^2 \cdot 10^2}k^{10}\right)$$

$$E(\phi) = \frac{\pi}{2}\left(1 - \frac{1}{2^2}k^2 - \frac{1 \cdot 3}{2^2 \cdot 4^2}k^4 - \frac{1 \cdot 3^2 5}{2^2 \cdot 4^2 \cdot 6^2}k^6 - \right.$$

$$\left. \frac{1 \cdot 3^2 \cdot 5^2 \cdot 7}{2^2 \cdot 4^2 \cdot 6^2 \cdot 8^2}k^8 - \frac{1 \cdot 3^2 \cdot 5^2 \cdot 7^2 \cdot 9^2}{2^2 \cdot 4^2 \cdot 6^2 \cdot 8^2 \cdot 10^2}k^{10}\right)$$

A series of field points may be selected in a given plane above the coils and the field contributions $H_z$ (z,r), $H_r$ (z,r) calculated due to each arc of each coil and summed at each field point. The field may be calculated at as many points as desired.

To achieve field uniformity along a line in the projection plane 7 a simple optimisation routine can be used on a set of linear equations with current as the free variable. See Table 1.

TABLE 1

| Field point/ | COIL | | | | Total value of field @ each field point |
|---|---|---|---|---|---|
| | 1 | 2 | 3 | 4 | |
| 1. | $H_z^1(1),I_1$ | $H_z^1(2),I_2$ | $H_z^1(3),I_3$ | $H_z^1(4),I_4$ | $S^1$ |
| 2. | $H_z^2(1),I_1$ | $H_z^2(2),I_2$ | $H_z^2(3),I_3$ | $H_z^2(4),I_4$ | $S^2$ |
| 3. | $H_z^3(1),I_1$ | $H_z^3(2),I_2$ | $H_z^3(3),I_3$ | $H_z^3(4),I_4$ | $S^3$ |
| 4. | $H_z^4(1),I_1$ | $H_z^4(2),I_2$ | $H_z^4(3),I_3$ | $H_z^4(4),I_4$ | $S^4$ |

This matrix may be resolved by pivotal condensation, as an example, to yield the values of $I_1$, $I_2$, $I_3$, $I_4$ where the I values are the multiplying factors of the originally chosen amp turns in each coil.

Using standard computing techniques a large number of field points may be chosen corresponding to a large number of coils.

Table 2 below gives an example using the four coils 1-4, each of 400 mm diameter and with an axial spacing of 600 mm which project a homogeneous line 600 mm above their common radial plane 6. In this example the field oscillation is about 6% of the projected field.

Each coil is an elemental arc with 10,000 Amp turns; field values are in gauss. It is practicable to increase all field values by a factor of at least 200, if each coil physically comprised about 6700 turns of conductor operating at 300 Amps.

The total length of conductor is about 33 km making this system a similar cost in superconductor terms per unit field in the homogenous zone as a standard solenoidal magnet.

TABLE 2

| COIL | Field Values at Z = 600 mm (Gauss) r(cm) | | | | | |
|---|---|---|---|---|---|---|
| | −100 | −80 | −60 | −40 | −20 | 0 |
| 1 | 9.3011 | 9.3011 | 5.4835 | 1.9439 | 0.3110 | −0.1940 |
| 2 | 0.3110 | 1.9439 | 5.4835 | 9.3011 | 9.3011 | 5.4835 |
| 3 | −0.2622 | −0.2870 | −0.1940 | 0.3110 | 1.9439 | 5.4835 |
| 4 | −0.1334 | −0.1695 | −0.2143 | −0.2622 | −0.0870 | −0.1940 |
| TOTAL | 9.2165 | 10.7885 | 10.5587 | 11.2938 | 11.2690 | 10.5790 |
| COIL | 20 | 40 | 60 | 80 | 100 | |
| 1 | −0.2870 | −0.2622 | −0.2143 | −0.1695 | −0.1334 | |
| 2 | 1.9439 | 0.3110 | −0.1840 | −0.2870 | −0.2622 | |
| 3 | 9.3011 | 9.3011 | 5.4835 | 1.9439 | 0.3110 | |
| 4 | 0.3110 | 1.9439 | 5.4835 | 9.3011 | 9.3011 | |
| TOTAL | 11.2690 | 11.2938 | 10.5587 | 10.7885 | 9.2165 | |

In Table 1, the choice of values for the total field at each point (in the example S1–S4) may be made either so the field has substantially the same value for each point S (as just described) or an impressed gradient may be set by some unique choice of values for each field point. For example, a first order gradient could be obtained for equidistance field points by nominating a set thus $S_1 = 1.111 * S_2 = 1.250 * S_3 = 1.429 * S_4$.

When a grid of points is chosen in three dimensions, a gradient in any direction may be defined using the sum of the coil fields at each point. The optimisation procedure will set out currents in the coils for each of the chosen sets of S values; if the coils were driven by separate power supplies it would, therefore, be easy to create gradients of exactly the required strength in any direction for imaging.

Figure 3:
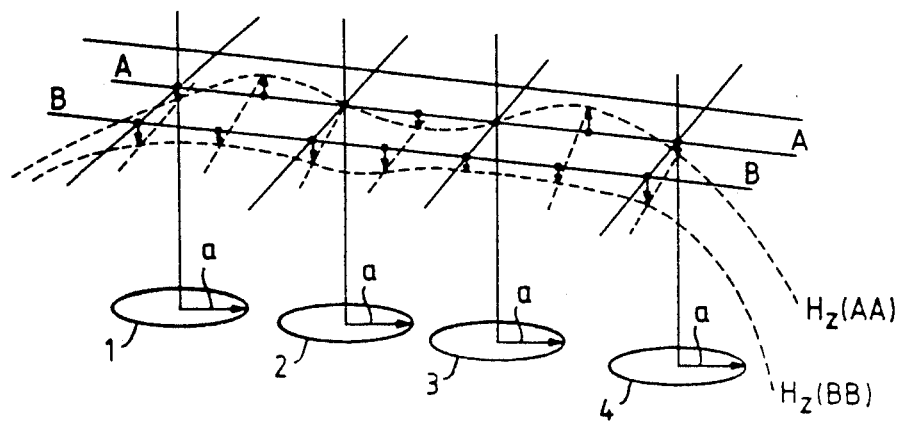
FIG. 3 illustrates the variation in magnetic field in the homogeneous zone due to part of the assembly shown in FIG. 1.

FIG. 3 illustrates the variation of the magnetic field in the homogeneous region in a direction perpendicular to the alignment direction of the coils. The field values given in table 2 above correspond to the field along the line A—A in FIG. 3. If the field is plotted along a second line B—B parallel to the line A—A, the field intensity will be less. Given a particular level of field variation peak to peak, the amount of sideways displacement of B—B may be defined. In this specific example, using only four coils 1-4 of equal amp turns, a 10% peak to peak oscillation permits 50 mm displacement either side of the optimisation line A—A. This effectively defines the plane of homogeneity. This homogeneous plane extends over three-quarters (approximately) of the length of the line joining the points of origin of the coils. Clearly the aspect ratio of length to width lends itself to sagittal imaging of patients in NMR imaging apparatus. For a fixed array of coils, the homogeneous region 7 may be moved closer to or further from the plane 6 of the coils 1-4 by varying the number of amp turns. In practice, the homogeneous region will have a small but finite thickness of about 10 mm.

If the magnet assembly is to be used in NMR imaging apparatus, a non-magnetic planar support 7' will be positioned just below the homogeneous region 7 above the plane 6. A patient may then lie on the support so that his body intersects the homogeneous region 7. One of the major advantages of this is that the narrowness of the homogeneous region 7 means that in NMR imaging it may not be necessary to use magnetic gradients to define a plane in the patient's body. This may simply be done by suitably positioning the support relatively to the homogeneous region. Alternatively, the support may be fixed relative to the plane 6 and the current through the coils 1-4 may be altered to move the homogeneous region.

Figure 4A:
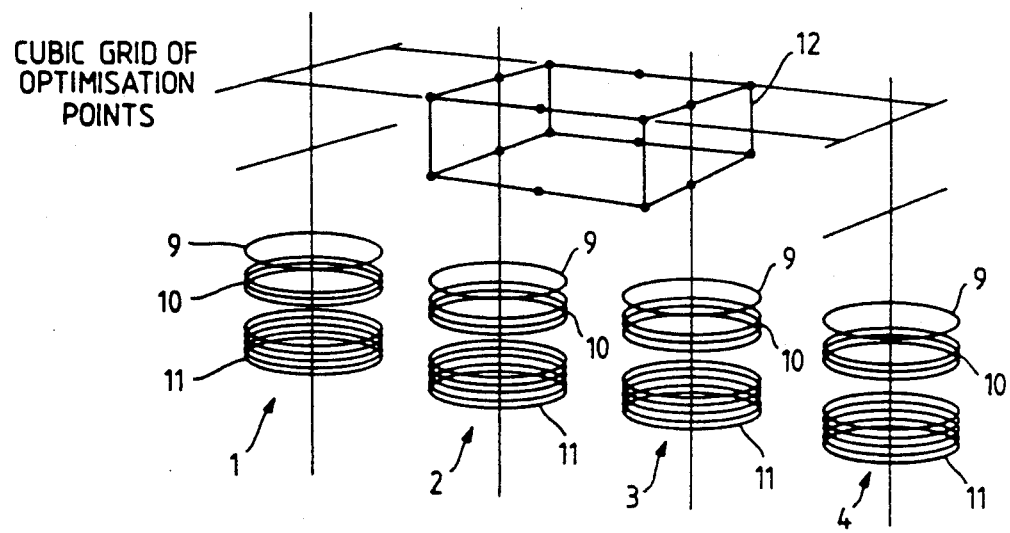
FIG. 4A illustrates a second example of the invention.

The homogeneous region may be provided with greater thickness by using more coils in the optimisation process and choosing field points on a cubic grid. This is illustrated in FIG. 4A where each coil 1-4 has been replaced by three subsidiary coils 9, 10, 11 mounted coaxially. The upper end turn of each coil 9 is positioned in a common plane as before. This arrangement of coils produces a cuboid homogeneous region 12.

Figure 4B:
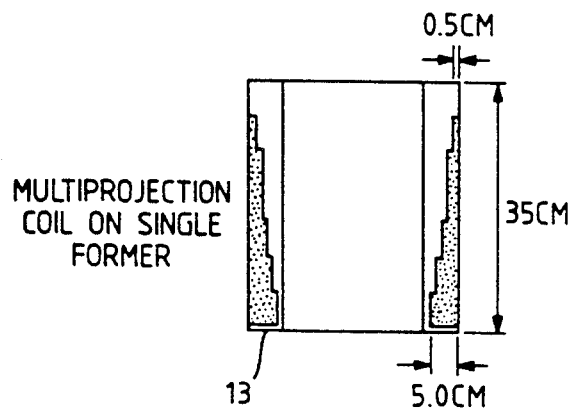
FIG. 4B illustrates a former for mounting the coils of the FIG. 4A example.

The requirement for different numbers of turns in the coils 9-11 can easily be achieved using a sectioned former 13 (FIG. 4B). Because of the large degree of projection achieved, the coils may be given a substantial length in their axial direction so achieving in effect a large number elemental arcs on relatively few physical supports. This makes possible a three dimensional imaging zone.

Figure 5:
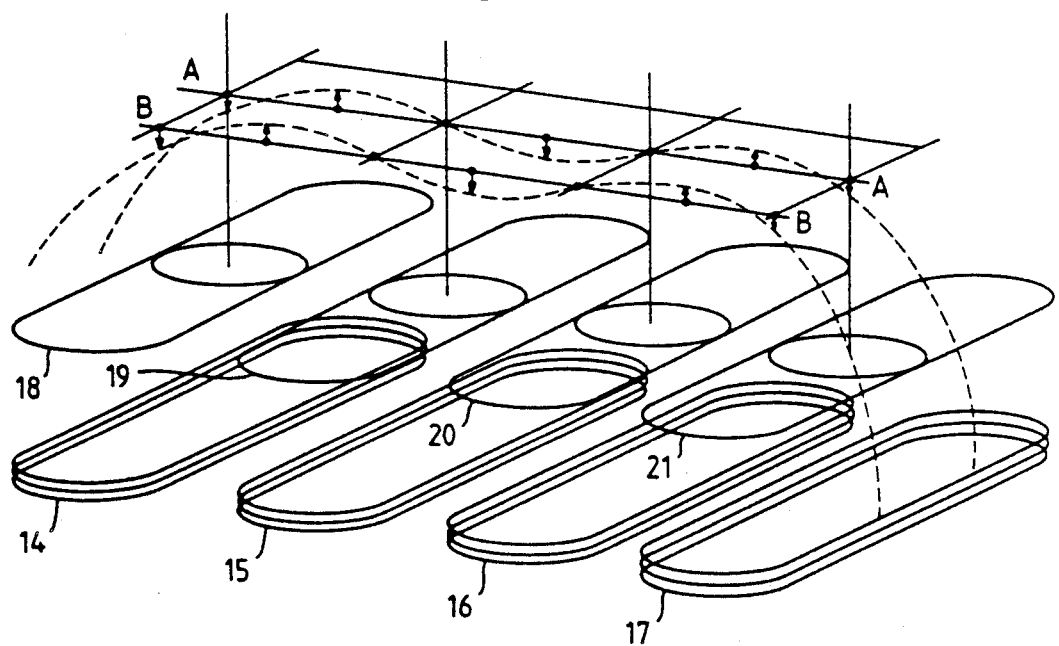
FIG. 5 illustrates a third example of the invention.

It is possible to provide improved uniformity in a homogeneous plane parallel to the surface of the magnetic assembly by changing the coil geometry from circular to semi-rectangular as illustrated by the four coils 14-17 (FIG. 5). Since the sides of the coils 14-17 normal to the line A—A are straight, the homogeneous line A—A (FIG. 3) is automatically maintained when the line is displaced sideways in the plane to B—B. The homogeneous region 7 may be increased in depth, in the same way as in the FIG. 4A example of circular arcs, by increasing the number of amp turns at different levels below the top of the magnet assembly, for example by providing additional semi-rectangular coils 18-21.

Due to the straight conducting sides of the coils 14-21, all the optimisation points from a given coil array may be chosen on the line A—A. This means a smaller variation in field along A—A occurs for a given number of coils than for circular arcs when, to attain two-dimensional uniformity, field points of optimisation need to lie on the line B—B as well as on A—A.

Figure 6:
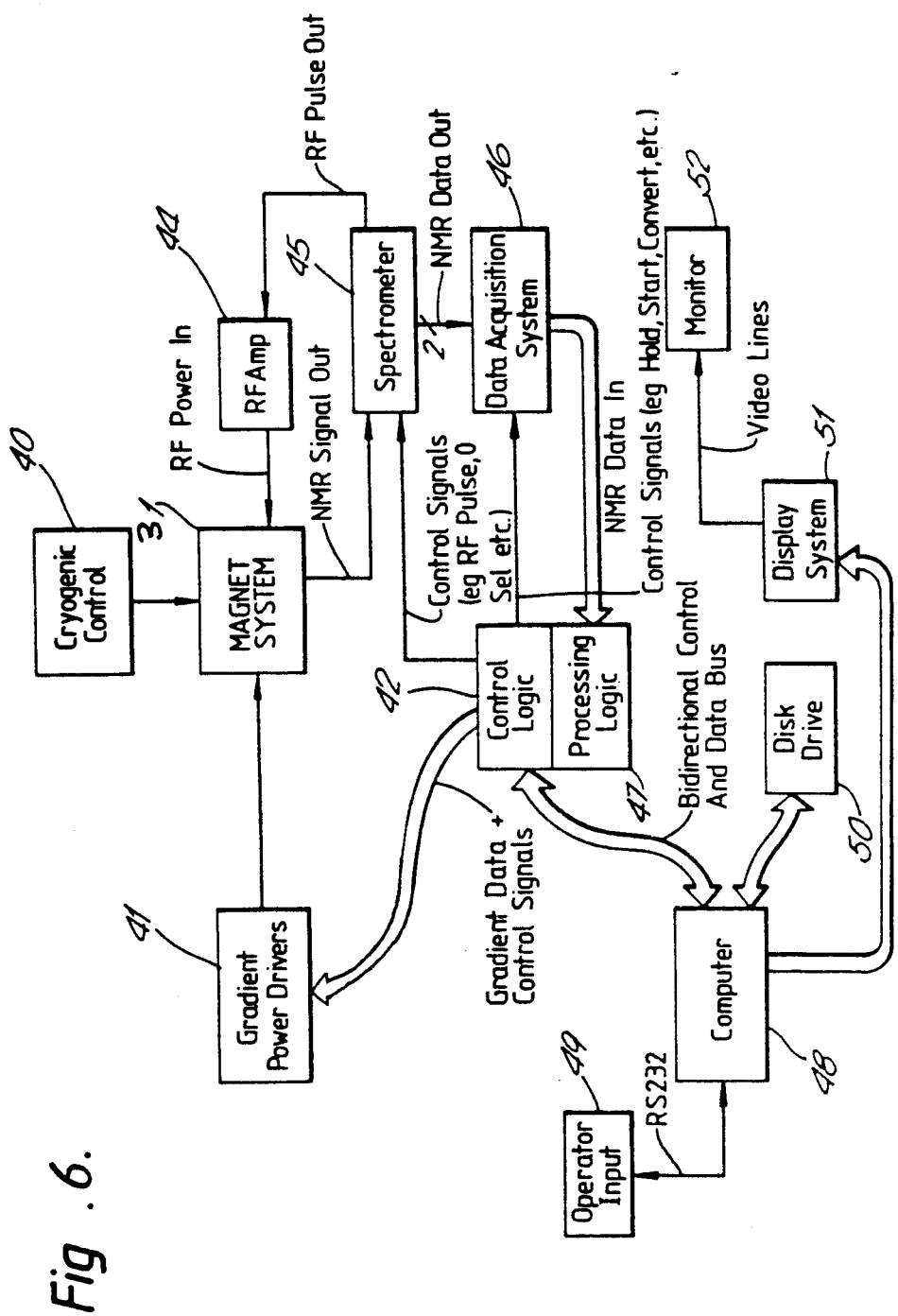
FIG. 6 is a block diagram of NMR imaging apparatus.

FIG. 6 illustrates in block diagram form NMR imaging apparatus which is of conventional form except for the magnet assembly which may be as described in any of the examples above. The apparatus comprises a magnet assembly 31 incorporating a power supply (not shown). The cryostat 6 is controlled by a cryogenic control system 40 of a conventional type.

Current through the coils 1-4 is controlled by a power drive 41 controlled from control logic 42. This enables either gradient fields to be set up in the region 7 or a thin enough uniform field to define a plane in the patient's body. Coils (not shown) for generating and receiving RF energy are also mounted on the magnet assembly, the RF transmitter being connected to an amplifier 44 which is connected to a spectrometer 45. The RF receiver which detects the NMR signal is also connected to the spectrometer 45. The generation of RF pulses is controlled by the control logic 42 which is connected to the spectrometer 45. NMR data from the spectrometer 45 passes to a data acquisition system 46 which is controlled by the control logic 42. Data from the system 46 then passes to processing logic 47.

The overall control of the system is provided by a computer 48 which is connected via a conventional RS 232 interface to an operator input station 49. Information for the computer is stored in a disc drive 50 while the results of the imaging experiments are passed by the computer to a display system 51 which can display "slices" through the patient's body on a monitor 52.

I claim:

1. A magnetic assembly, comprising:
   a plurality of magnetic field generating means, each having a magnetic field vector defined by a line from the north pole to the south pole and positioned in a volume so that the magnetic field vectors have substantially the same direction and are laterally spaced apart, for generating a magnetic field having controlled characteristics in a substantially planar region outside said volume.

2. An assembly according to claim 1, wherein said magnetic field generating means comprise electrical coils adapted to carry working currents.

3. An assembly according to claim 2, wherein each said coil has an end turn, said end turns of each coil defining respective planes, said planes being positioned in a common plane.

4. An assembly according to claim 2, wherein each coil defines a respective axis, each said coil being formed from a plurality of subsidiary coaxial coils spaced along respective ones of said axes.

5. An assembly according to claim 2, wherein said coils are formed of a superconducting material.

6. An assembly according to claim 1, wherein the assembly further comprises:
   a support means for supporting an object to be exposed to said magnetic field in said region, said support means including a non-magnetic material and being positioned between said magnetic field generating means and said region.

7. An assembly according to claim 1, wherein said assembly defines a portion of a nuclear magnetic resonance imaging apparatus.

8. An assembly according to claim 7, wherein said magnetic field generating means comprises:
   electrical coils and said nuclear magnetic imaging apparatus further comprises control means for controlling currents flowing in said coils so as to control the characteristics of said magnetic field in said region.

9. An assembly according to claim 1, wherein said magnetic field within said substantially planar region is homogeneous.

10. An assembly according to claim 1, wherein said magnetic field vectors are laterally spaced apart at regular intervals.

11. An assembly according to claim 1, wherein said magnetic field generating means are arranged a two dimensional array.

12. An assembly as recited in claim 1, wherein said region faces a boundary surface of said volume, and said region is accessible from all directions facing said boundary surface.

13. A method of operating a magnetic assembly comprising a plurality of electrical coils, each coil having a magnetic field vector defined by a line from the north pole to the south pole and positioned in a volume so that the magnetic field vectors have substantially the same direction and are laterally spaced apart, for generating a magnetic field having controlled characteristics in a substantially planar region outside said volume, said method comprising the steps of:
   providing said coils with electrical current from a power source; and
   controlling the magnitude of said current flowing through each coil so that said magnetic field is generated.

14. A method according to claim 13, further comprising the step of:
   causing currents of controlled magnitudes to flow through said coils to produce a gradient magnetic field in said region.

15. A method according to claim 13, wherein said magnetic field within said substantially planar region is homogeneous.

* * * * *